United States Patent [19]

Ishikawa et al.

[11] Patent Number: 4,645,946
[45] Date of Patent: Feb. 24, 1987

[54] TWO PHASE TRAPEZOIDAL SIGNAL GENERATING CIRCUIT

[75] Inventors: Fumio Ishikawa; Kuninobu Tanaka, both of Kanagawa, Japan

[73] Assignee: Sony Corporation, Tokyo, Japan

[21] Appl. No.: 615,542

[22] Filed: May 31, 1984

[30] Foreign Application Priority Data

May 31, 1983 [JP] Japan .................................. 58-96381

[51] Int. Cl.⁴ .......................... H03K 5/08; H03K 5/00
[52] U.S. Cl. .................................... 307/261; 307/262; 307/263; 307/268; 307/269; 307/555
[58] Field of Search ............... 307/262, 263, 511, 513, 307/260, 261, 268, 269, 555; 328/57, 60, 62

[56] References Cited

U.S. PATENT DOCUMENTS 3,219,839 11/1965 Fletcher .............................. 307/262
3,868,519 2/1975 Green .................................. 307/263

Primary Examiner—Stanley D. Miller
Assistant Examiner—M. R. Wambach
Attorney, Agent, or Firm—Hill, Van Santen, Steadman & Simpson

[57] ABSTRACT

A two phase voltage signal generating circuit for generating a pair of trapezoidal wave signals of phases opposite to each other is disclosed which includes an input terminal supplied with an input pulse signal, a capacitor, a pair of voltage limiting circuits connected to both ends of the capacitor respectively and for limiting the voltage at each end of the capacitor within a predetermined voltage range, a current control circuit controlled by the input pulse signal and for supplying a charge or discharge current to the capacitor to generate the pair of trapezoidal wave voltage signals at the both ends of the capacitor, a detecting circuit for detecting the change of the intermediate voltage of the trapezoidal wave voltage signals and a symmetry control circuit controlled by an output of the detecting circuit and for controlling the charge or discharge current such that the pair of trapezoidal wave voltage signals become substantially symmetrical to each other.

7 Claims, 13 Drawing Figures

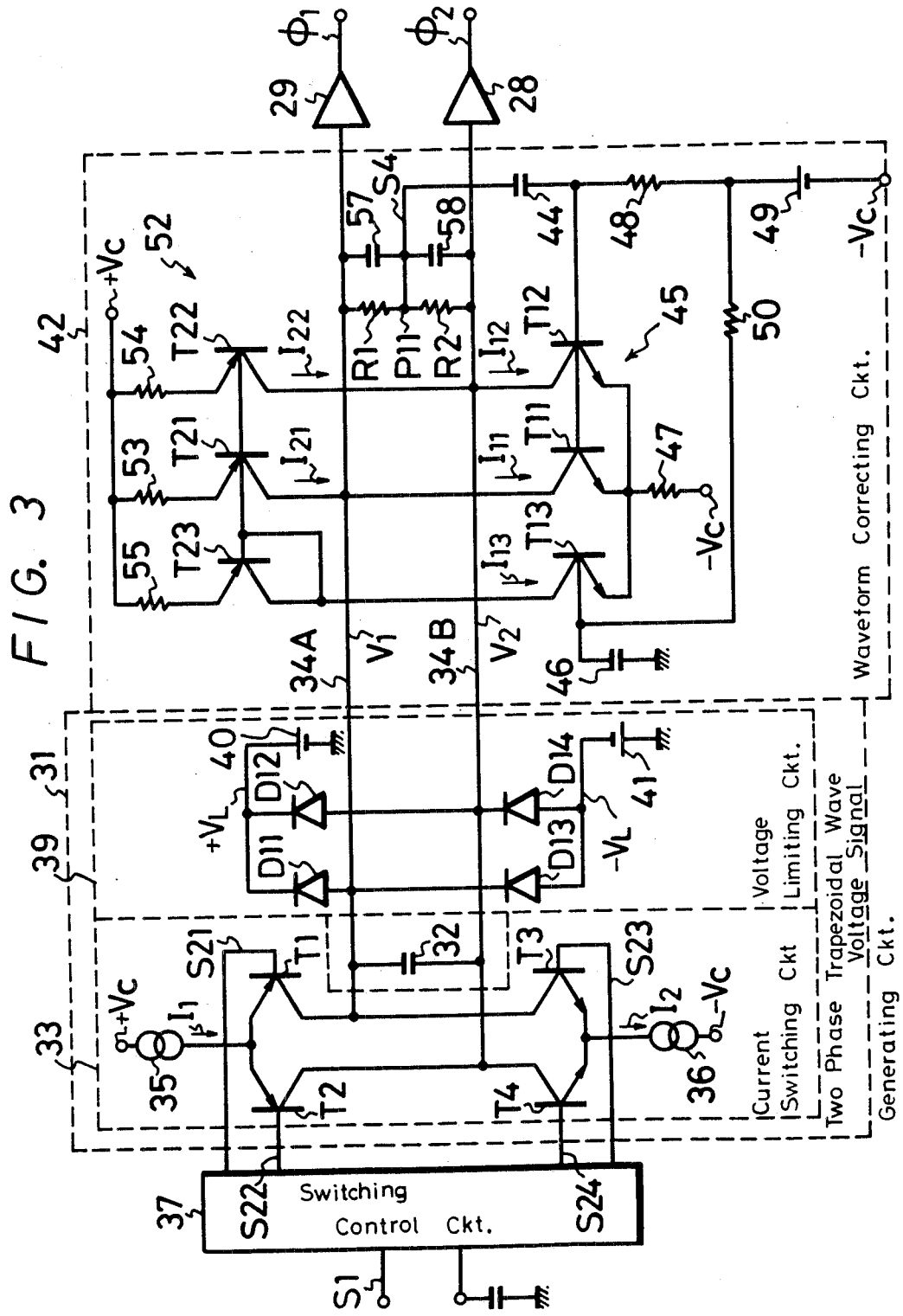

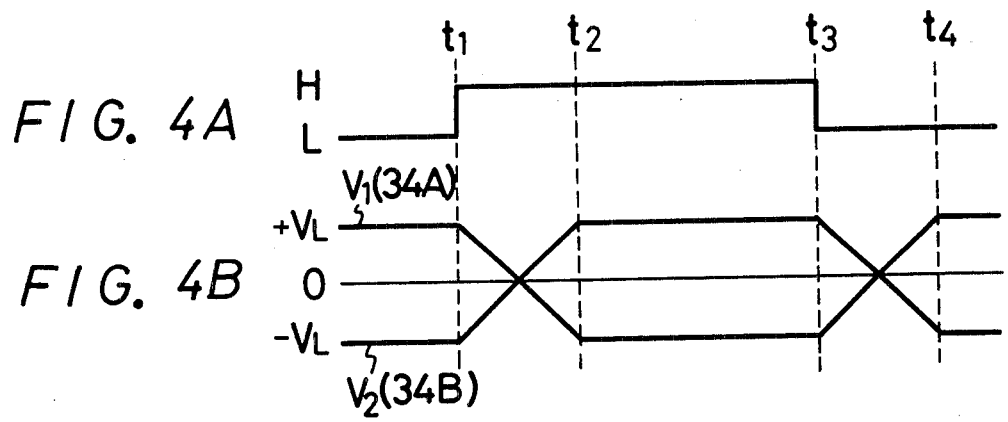
FIG. 4A
FIG. 4B
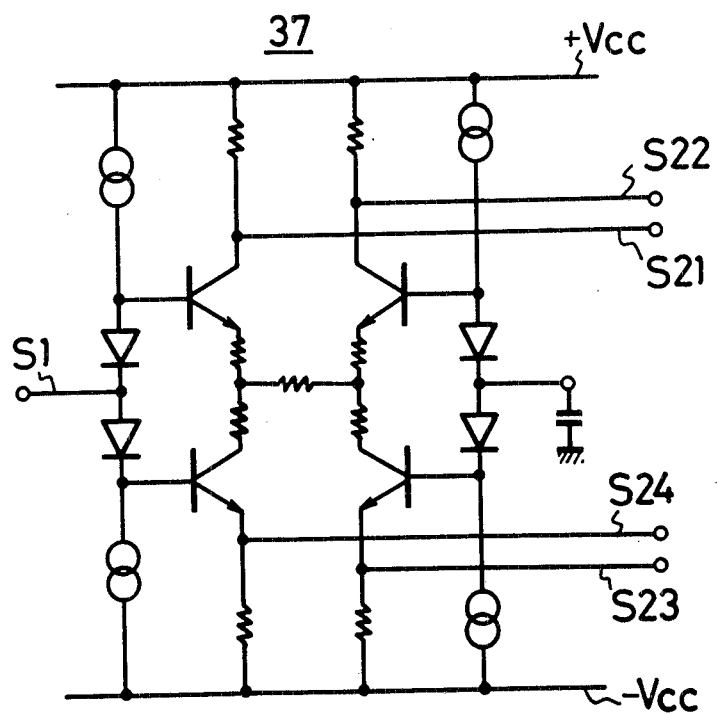
FIG. 5

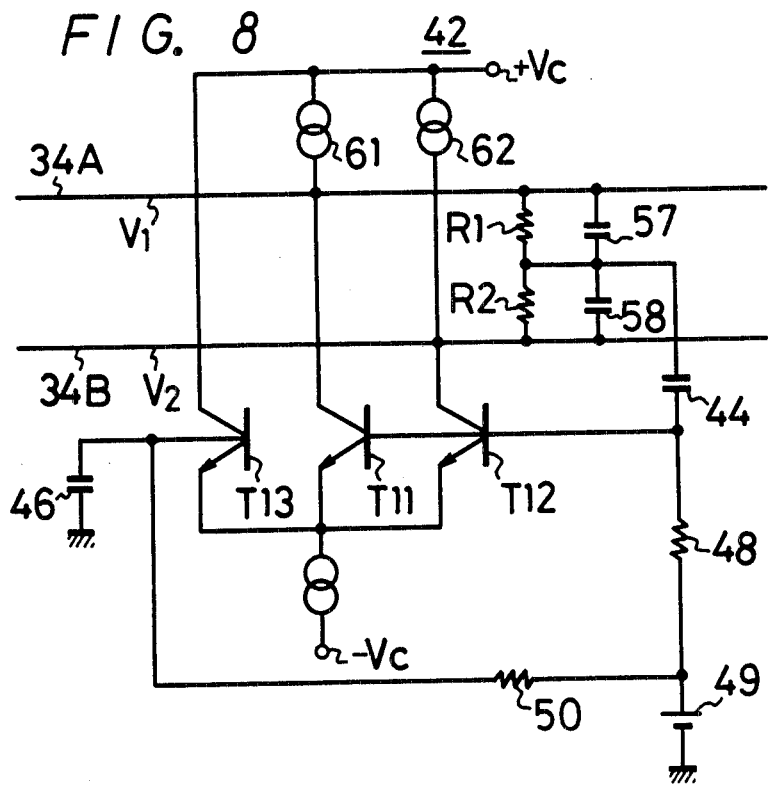

TWO PHASE TRAPEZOIDAL SIGNAL GENERATING CIRCUIT

BACKGROUND OF THE INVENTION

1. Field of the Invention

The present invention relates generally to two phase voltage signal generating circuits and more particularly is directed to a two phase voltage signal generating circuit suitable for being applied to a circuit such as a sample-and-hold circuit of, for example, an analog-to-digital converting circuit which requires two phase pulse signals of phases opposite to each other.

2. Description of the Prior Art

A sample-and-hold circuit 1 of an analog-to-digital converting circuit has hitherto been proposed which includes a diode bridge circuit 2 as shown in FIG. 1. Reference numeral 3 designates its drive circuit which supplies a pulse signal from a pulse generating circuit 4 through a transformer 5 to drive terminals P1 and P2 of the diode bridge circuit 2 to thereby make diodes D1 to D4 of the diode bridge circuit 2 forward-biased and then turned on. Thus, an input voltage VI at an input terminal 6 is sampled in a capacitor 8 connected to an output terminal 7 through signal terminals P3 and P4 of the diode bridge circuit 2. Thereafter, the diode bridge circuit 2 is reverse-biased to be turned off, whereby the sampled voltage is held by the capacitor 8 and then developed at the output terminal 7 as an output voltage V0.

Since the drive circuit 3 employs the transformer 5, it is quite inconvenient for the sample-and-hold circuit 1 to be formed as an integrated circuit (IC). To solve this problem, such a circuit as shown in FIG. 2 is proposed in which two pulse signals $\phi_1$ and $\phi_2$ of phases opposite to each other are generated from a two phase pulse signal generating circuit 11 and then supplied across drive terminals P1 and P2 of a diode bridge circuit 12.

In FIG. 2, in the sample-and-hold circuit 1, the two phase pulse signals $\phi_1$ and $\phi_2$ of phases opposite to each other derived from the two phase pulse signal generating circuit 11 are supplied through D.C. blocking capacitors 13 and 14 to the drive terminals P1 and P2 of the diode bridge circuit 12. In this case, during the interval in which the pulse signal $\phi_1$ of positive phase changes from low potential to high potential (accordingly, in which the pulse signal $\phi_2$ of opposite phase changes from high potential to low potential), all diodes D1 to D4 connected to the bridge sides of the diode bridge circuit 12 are turned on, whereby the input voltage VI applied to the signal input terminal P3 from an input terminal 6 is supplied through the diodes D1 to D4 to a sampling-and-holding capacitor 15 connected to a signal output terminal P4 and then sampled therein. Subsequently, in the interval during which the pulse signal $\phi_1$ of positive phase changes from high potential to low potential (accordingly, during which the pulse $\phi_2$ of opposite phase changes from low potential to high potential), the diodes D1 to D4 are all turned off, whereby the sampled voltage in the sampling-and-holding capacitor 15 is held and then delivered to an output terminal 17. This sampled voltage is digitally converted in the circuit at the succeeding stage.

The two phase pulse signal generating circuit 11 includes a differential amplifying circuit consisting of a pair of transistors 21 and 22 whose emitters are connected together to a constant current source 23. An input pulse of, for example, ½ duty ratio is supplied from a drive signal source 24 to the base of the transistor 21, while a reference voltage from a reference voltage source 25 is supplied to the base of the other transistor 22. From respective connection points between the collectors of the transistors 21 and 22 and output resistors 26 and 27 the pulse signals $\phi_2$ and $\phi_1$ of opposite and normal phases are delivered through buffer amplifying circuits 28 and 29, respectively.

The two pulse signals $\phi_1$ and $\phi_2$ are supplied through the D.C. blocking capacitors 13 and 14 to the diode bridge circuit 12, whereby the diode bridge circuit 12 is disconnected in D.C. manner from the two phase pulse signal generating circuit 11 so as not to influence the sampled voltage held in the sampling-and-holding capacitor 15. Further, in order to avoid bad influence of the capacitors 13 and 14, a discharge diode D5 is connected between the drive terminals P1 and P2 of the diode bridge circuit 12. As a result, when the diode bridge circuit 12 is turned off, the charges stored in the capacitors 13 and 14 are discharged through the discharge diode D5.

By the way, in the prior art two phase pulse signal generating circuit 11 of the circuit arrangement shown in FIG. 2, when the timing at which the pulse signal $\phi_1$ of positive phase and the pulse signal $\phi_2$ of opposite phase are inverted is displaced or when the wave forms thereof upon inverting are not symmetrical to each other, the absolute value $|\phi_1-\phi_2|$ of the voltages applied to the drive signal terminals P1 and P2 of the diode bridge circuit 12 is partly fluctuated (if the phases of the pulse signals $\phi_1$ and $\phi_2$ are perfectly opposite to each other, the absolute value $|\phi_1-\phi_2|$ is constant), and there is then a defect that the above fluctuated component is leaked to the signal output terminal P4. In practice, when the circuit arrangement shown in FIG. 2 is applied as the two phase pulse signal generating circuit 11, due to variable of characteristics of the transistors 21 and 22 which constitute the differential amplifying circuit variable tolerance of the load resistors 26 and 27, stray capacitance of each circuit element portion, variable inductances of leads and the like, it is not possible that the inverting operations of the transistors 21 and 22, namely, the phases and waveforms of the two pulse signals $\phi_1$ and $\phi_2$ are made coincident with each other.

OBJECTS AND SUMMARY OF THE INVENTION

Accordingly, it is an object of the present invention to provide an improved two phase voltage signal generating circuit.

It is another object of the present invention to provide a two phase voltage signal generating circuit in which the waveforms of a pair of two phase voltage signals opposite in phase can be corrected to be symmetrical upon inversion.

It is a further object of the present invention to provide a two phase voltage signal generating circuit which is suitable for being formed into an integrated circuit (IC).

According to one aspect of the present invention, there is provided a two phase voltage signal generating circuit for generating a pair of trapezoidal wave signals of phases opposite to each other comprising:

(A) an input terminal supplied with an input pulse signal;

(B) a capacitor;

(C) a pair of voltage limiting circuits connected to both ends of said capacitor respectively and for limiting the voltage at each end of said capacitor within a predetermined voltage range;

(D) a current control circuit controlled by said input pulse signal and for supplying a charge or discharge current to said capacitor to generate said pair of trapezoidal wave voltage signals at the both ends of said capacitor;

(E) a detecting circuit for detecting the change of the intermediate voltage of said pair of trapezoidal wave voltage signals; and (F) a symmetry control circuit controlled by an output of said detecting circuit and for controlling said charge or discharge current such that said pair of trapezoidal wave voltage signals become substantially symmetrical to each other.

The other objects, features and advantages of the present invention will become apparent from the following description taken in conjunction with the accompanying drawings through which the like references designate the same elements and parts.

BRIEF DESCRIPTION OF THE DRAWINGS

FIG. 3 is a circuit diagram showing an embodiment of a two phase voltage signal generating circuit according to the present invention;

FIGS. 4A and 4B are respectively signal waveform diagrams useful for explaining an operation of a two phase trapezoidal wave signal generating circuit used in the two phase voltage signal generating circuit of the invention shown in FIG. 3;

FIG. 5 is a circuit diagram showing a practical circuit arrangement of a switching control circuit used in the two phase voltage signal generating circuit of the invention shown in FIG. 3;

FIG. 8 is a circuit diagram showing another embodiment of the waveform correcting circuit according to the present invention;

FIG. 9 is a circuit diagram showing another embodiment of the voltage limiting circuit according to the present invention;

DESCRIPTION OF THE PREFERRED EMBODIMENTS

Figure 1:
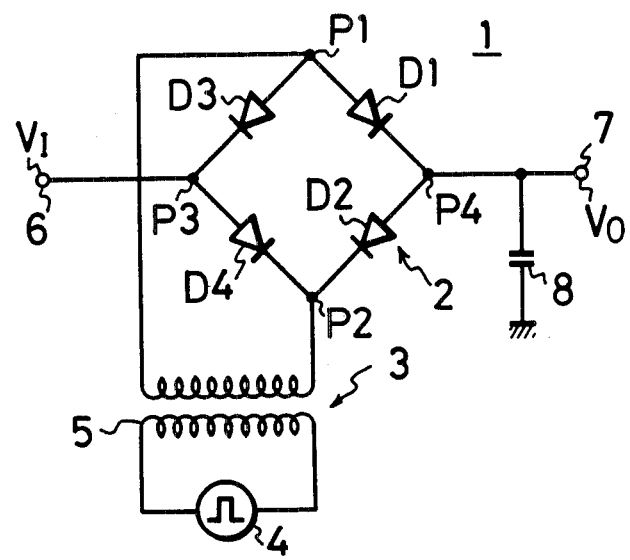
FIG. 1 is a circuit diagram of a prior art sample-and-hold circuit to which a two phase voltage signal generating circuit is applied.

Now, the present invention will hereinafter be described in detail with reference to the drawings. FIG. 3 is a circuit diagram showing an embodiment of the two phase voltage signal generating circuit according to the present invention.

In FIG. 3, reference numeral 31 designates a two phase trapezoidal wave voltage signal generating circuit which includes a voltage waveform generating capacitor 32. When a current of positive or negative polarity passes through a current switching circuit 33 to the capacitor 32, the voltages at the both ends of the capacitor 32 are respectively delivered through buffer circuits 29 and 28 connected to output lines 34A and 34B as a signal $\phi_1$ of positive phase and a signal $\phi_2$ of opposite phase.

The current switching circuit 33 includes positive side transistors T1 and T2 which allow the output current of a constant current source 35 connected to a positive side voltage source $+V_C$ to respectively pass to the ends of the output line 34A and 34B of the capacitor 32 and negative side transistors T3 and T4 which allow the output current of a constant current source 36 connected to a negative side voltage source $-V_C$ to respectively pass to the ends of the output line 34A and 34B of the capacitor 32. When a sampling pulse input signal S1 is at, for example, logic "H (high)" level, a switching control circuit 37, which is supplied with the sampling pulse input signal S1, delivers switching control signals S21 and S24 which respectively turn on the positive side transistor T1 and the negative side transistor T4. On the contrary, when the sampling pulse input signal S1 is at, for example, logic "L (low)" level, the switching control circuit 37 delivers switching control signals S22 and S23 which respectively turn on the positive side transistor T2 and the negative side transistor T3. As a result, when the sampling pulse S1 is at logic "H" level as shown in FIG. 4A, the capacitor 32 is made in the first charged state under which a voltage $V_2$ on the line 34B is raised in the positive direction while a voltage $V_1$ on the line 34A is lowered in the negative direction as shown in FIG. 4B. On the contrary, when the sampling pulse S1 is at logic "L" level, the capacitor 32 is made in the second charged state under which the voltage $V_2$ on the line 34B is lowered in the negative direction while the voltage $V_1$ on the line 34A is raised in the positive direction. In this case, the changing speeds at which the voltages $V_1$ and $V_2$ are raised and/or lowered are determined by the values of output currents $I_1$ and $I_2$ from the constant current sources 35 and 36. A circuit with the arrangement shown in FIG. 5 can be applied as the switching control circuit 37.

Turning back to FIG. 3, a voltage limiting circuit 39 is connected to the output lines 34A and 34B to prevent the capacitor 32 from being charged more than positive and negative side limiting voltages $+V_L$ and $-V_L$ as shown in FIG. 4B. In other words, to the output lines 34A and 34B, there are respectively connected through diodes D11 and D12 a positive voltage source 40 in the reverse direction so that when the voltage $V_1$ or $V_2$ of the output line 34A or 34B exceeds the output voltage $+V_L$ of the positive voltage source 40, the diode D11 or D12 is turned on to permit the capacitor 32 to be discharged. As a result, the voltages $V_1$ and $V_2$ of the output lines 34A and 34B are prevented from being increased more than the limiting voltage $+V_L$. In like manner, to the output lines 34A and 34B, there are respectively connected through diodes D13 and D14 a negative voltage source 41 in the reverse direction so that when the voltage $V_1$ or $V_2$ of the output line 34A or 34B is lowered below the output voltage $-V_L$ of the negative voltage source 41, the diode D13 or D14 is turned on to permit the capacitor 32 to be discharged. As a result, the voltages $V_1$ and $V_2$ of the output lines 34A and 34B are prevented from being lowered below the limiting voltage $-V_L$.

To the output lines 34A and 34B is connected a waveform correcting circuit 42 which always corrects the differential center values of the voltages on the output lines 34A and 34B to the reference value. More particularly, a series circuit of voltage-dividing resistors R1 and R2 is connected between the output lines 34A and 34B, whereby a differential detected signal S4 representing the differential center value of the voltages $V_1$ and Vhd 2 (in this case, the value of ½) of the output lines 34A and 34B is produced from a connection point P11 between the resistors R1 and R2. This differential detected signal S4 is supplied through a D.C. blocking capacitor 44 to a negative side differential circuit 45 as its drive input. The negative side differential circuit 45 includes a first set of NPN transistors T11 and T12 supplied at their bases with the differential detected signal S4 and the emitters of which are connected together and a second NPN transistor T13 the base of which is connected through a D.C. blocking capacitor 46 to the ground as a reference potential in an A.C. manner. The emitter of the transistor T13 is connected through a load resistor 47 to the negative voltage source $-V_C$ together with the emitters of the first set of transistors T11 and T12. In this case, a bias voltage source 49 is connected through a resistor 48 to the bases of the first transistors T11 and T12 and the bias voltage source 49 is also connected through a resistor 50 to the base of the second transistor T13.

The collectors of the first transistors T11 and T12 are respectively connected to the output lines 34A and 34B, by which, in accordance with the differential detected signal S4 supplied to the bases thereof, when the voltages thereof are raised, currents $I_{11}$ and $I_{12}$ derived from the output lines 34A and 34B to the negative voltage source $-V_C$ are made large.

On the other hand, the collector of the second transistor T13 is connected to a drive transistor T23 of PNP type connected in a manner of a diode in a positive side current mirror circuit 52. Collectors of current mirror transistors T21 and T22 of PNP type are respectively connected to the output lines 34A and 34B and emitters of transistors T21, T22 and T23 are respectively connected through load resistors 53, 54 and 55 to the positive voltage source $+V_C$. As a result, when the voltage of the differential detected signal S4 is raised to allow the first negative side transistors T11 and T12 to increase the currents $I_{11}$ and $I_{12}$ derived from the output lines 34A and 34B as mentioned above, the collector current $I_{13}$ of the second negative side transistor T13 becomes small so that currents $I_{21}$ and $I_{22}$ derived through the positive side transistors T21 and T22 to the output lines 34A and 34B from the positive voltage source $+V_C$ are made small. In this case, capacitors 57 and 58 are respectively connected in parallel to the differential detecting resistors R1 and R2 which transmit the changes of the voltages of the output lines 34A and 34B to the connection point P11 at high speed.

Figure 2:
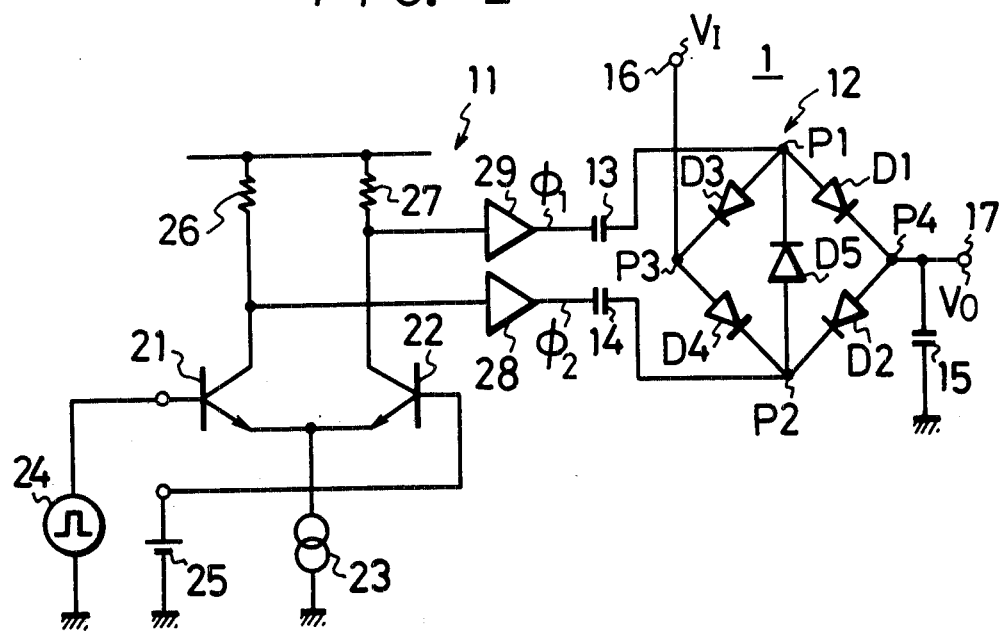
FIG. 2 is a circuit diagram of a previously proposed two phase voltage signal generating circuit which is formed into an integrated circuit (IC)

As described above, the voltages $V_1$ and $V_2$ produced on the output lines 34A and 34B are supplied through the buffer circuits 29 and 28 to, for example, the sample-and-hold circuit 1 (see FIG. 2) as the two phase pulse signals $\phi_1$ and $\phi_2$.

In the above circuit arrangement, the absolute values of the voltages $+V_L$ and $-V_L$ of the positive and negative voltage sources 40 and 41 in the voltage limiting circuit 39 are selected to be equal to each other and the resistance values of the differential-detecting resistors R1 and R2 are selected to be equal to each other. In this case, let us assume that the circuit shown in FIG. 3 be operated under an ideal condition in which the current values $I_1$ and $I_2$ of the constant current sources 35 and 36 in the current switching circuit 33 are equal to each other, the stray capacity values viewed from the both ends of the voltage waveform generating capacitor 32 to the current switching circuit 33 upon rising and falling of the voltages $V_1$ and $V_2$ on the output lines 34A and 34B are equal to each other and the transistors T1 to T4 are operated simultaneously. Under this ideal condition, if the sampling input pulse signal S1 changes from its logic low level "L" to logic high level "H" at time point $t_1$ in FIG. 4A, the transistors T2 and T3 in the current switching circuit 33 are turned on in correspondence therewith and the transistors T1 and T4 are turned off so that the voltage $V_2$ at the output line 34B of the capacitor 32 rises up at the speed determined by the current value $I_1$ from the constant current source 35, while the voltage $V_1$ at the output line 34A of the capacitor 32 falls down (see FIG. 4B) at the speed determined by the current value $I_2$ from the constant current source 36.

At time point $t_2$ after time point $t_1$, when the voltages $V_1$ and $V_2$ become equal to the limiting voltages $-V_L$ and $+V_L$ of the voltage limiting circuit 39, the voltages $V_1$ and $V_2$ thereafter respectively maintain the limiting voltages $-V_L$ and $+V_L$ (see FIG. 4B).

Thereafter, at time point $t_3$, when the sampling input pulse signal S1 changes from its logic high level "H" to logic low level "L", in the current switching circuit 33 the transistors T1 and T4 are turned on and the transistors T2 and T3 are turned off in correspondence therewith so that the voltages $V_1$ and $V_2$ of the output lines 34A and 34B of the capacitor 32 respectively rise up and fall down at the speed determined by the current values from the constant current sources 35 and 36 (see FIG. 4B). After that, at time point $t_4$, when the voltages $V_1$ and $V_2$ become equal to the limiting voltages $+V_L$ and $-V_L$ of the voltage limiting circuit 39, the voltages $V_1$ and $V_2$ thereafter respectively maintain the limiting voltages $+V_L$ and $-V_L$ (see FIG. 4B).

As mentioned above, if each circuit element is operated under such ideal condition, the voltages $V_1$ and $V_2$ of the output lines 34A and 34B have the phase relation opposite to each other as shown in FIG. 4B and trapezoidal waveforms which are symmetrical to each other, which then are delivered through the buffer circuits 29 and 28 as the two phase pulse signals $\phi_1$ and $\phi_2$.

Figure 6:
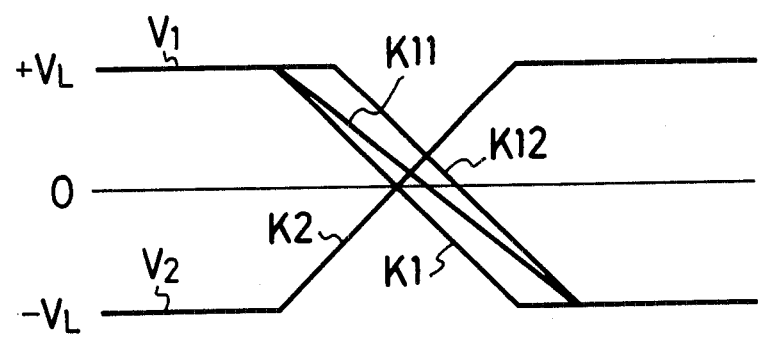
FIG. 6 is a signal waveform diagram useful for explaining the reason why the waveforms of the two phase trapezoidal wave signals become asymmetrical to each other.

However, in practice, it is difficult to set the currents $I_1$ and $I_2$ from the constant current sources 35 and 36 in the current switching circuit 33 equal to each other. Moreover, the stray capacity values viewed from the both ends of the capacitor 32 upon rising and falling of the voltages $V_1$ and $V_2$ do not become equal to each other. As a result, as shown by curves K11 and K2 in FIG. 6, there is a fear that the relative speeds at which the voltage levels of the voltages $V_1$ and $V_2$ are changed may not become equal to each other (the curve K11 is different from the changing speed from a changing speed shown by a curve K1 representing the ideal condition). In addition, practically, the transistors T1 to T4 in the current switching circuit 33 are not operated simultaneously and hence, as shown by the curve K12 in FIG. 6, even if the changing speed becomes equal to that by the curve K2, there still remains a fear that the changing timings of the voltages $V_1$ and $V_2$ may be displaced.

Figure 7:
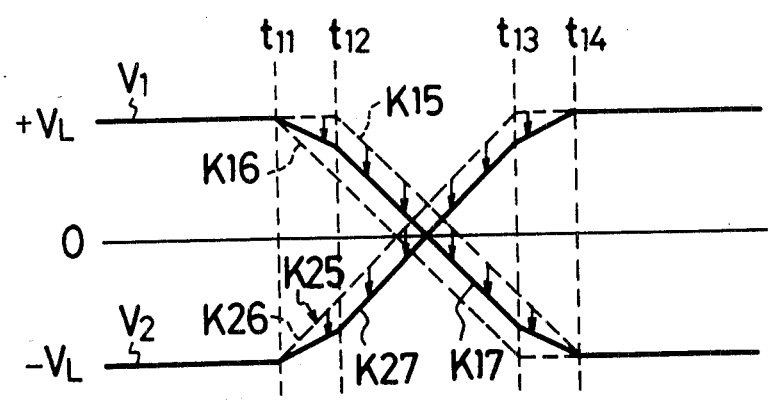
FIG. 7 is a signal waveform diagram useful for explaining the correcting operation of a waveform correcting circuit used in the two phase voltage signal generating circuit of the invention shown in FIG. 3.

Accordingly, in practice, the waveforms of the voltages $V_1$ and $V_2$ of the output lines 34A and 34B do not become symmetrical to each other. For example, as shown in FIG. 7, at time point $t_{11}$, the voltage $V_2$ starts to rise up along a broken line curve K25, while the voltage $V_1$ starts to fall down along a broken line curve K15 at time point $t_{12}$ after the time point $t_{11}$. At succeeding time point $t_{13}$, the voltage $V_2$ reaches to the limiting voltage $+V_L$, while at succeeding time point $t_{14}$, the voltage $V_1$ reaches to the limiting voltage $-V_L$. As a result, the problem arises that the waveforms of the voltages $V_1$ and $V_2$ may not become symmetrical to each other.

In this case, in order to make the waveforms of the voltages $V_1$ and $V_2$ symmetrical to each other, the waveform correcting circuit 42 performs the correcting operation as follows. In the interval from time points $t_{11}$ to $t_{12}$ in FIG. 7, the broken line curve K25 rises up, while the broken line K15 maintains the limiting value $+V_L$ so that the center potential between the curves K15 and K25 is raised. This means that the potential at the intermediate point P11 of the differential detecting circuit, accordingly, the differential detected signal S4 is raised from a reference value (in the case of this embodiment, 0 Volt), which then is fed to the bases of the transistors T11 and T12 of the negative side differential circuit 45. At that time, due to the differential operation thereof, the collector currents $I_{11}$ and $I_{12}$ of the transistors T11 and T12 are increased, while the collector current $I_{13}$ of the transistor T13, accordingly, the collector currents $I_{21}$ and $I_{22}$ of the transistors T21 and T22 in the positive current mirror circuit 52 are decreased.

Under this state, the current $I_{11}$ derived through the negative side transistor T11 to the negative voltage source $-V_C$ from the output line 34A is increased, while the current $I_{21}$ taken in the output line 34A from the positive voltage source $+V_C$ through the positive side transistor T21 is decreased so that the voltage $V_1$ of the output line 34A is lowered. Similarly, the current $I_{12}$ derived through the negative side transistor T12 to the negative voltage source $-V_C$ from the output line 34B is increased, while the current $I_{22}$ taken in the output line 34B from the positive voltage source $+V_C$ through the positive side transistor T22 is decreased so that the voltage $V_2$ of the output line 34B is lowered. As described above, since both the voltages $V_1$ and $V_2$ at the both ends of the differential detecting resistors R1 and R2 are lowered, the differential detected signal S4 as the intermediate potential between the voltages $V_1$ and $V_2$ is lowered. As a result, when the value of the differential detected signal S4 becomes coincident with the reference value (0 Volt) the waveforms of the voltages $V_1$ and $V_2$ become stable.

Accordingly, if a curve K16 which is symmetrical to a curve K26 representing the voltage $V_2$ before being corrected in FIG. 7 is taken into consideration, the voltage $V_1$ is lowered by the amount of value which is provided by dividing the differential voltage between the voltage represented by the curve K16 and the voltage $V_1$ before being corrected as shown by the curve K15 by the dividing ratio between the differential detecting resistors R1 and R2 as shown by arrows, while the voltage $V_2$ is also lowered by the same amount of value. As a result, the voltages $V_1$ and $V_2$ are corrected to be the voltages represented by curves K17 and K27 which pass through the corrected potential point.

The similar correcting operation to that of the duration from time points $t_{11}$ to $t_{12}$ is carried out during the periods from succeeding time points $t_{12}$ to $t_{13}$ and from time points $t_{13}$ to $t_{14}$ so that during the whole of the interval from time points $t_{11}$ to $t_{14}$ in which the voltages $V_1$ and $V_2$ change their levels, the intermediate potential between the differential voltages of the voltages $V_1$ and $V_2$ is corrected so as to become coincident with the reference value. As a result, it is practically possible to make the waveforms of the voltages $V_1$ and $V_2$ generated on the output lines 34A and 34B symmetrical to each other.

While the above correcting operation is given on the case where the differential detected signal S4 exceeds the reference value, when the differential detected signal S4 decreases than the reference value, the collector currents $I_{11}$ and $I_{12}$ of the transistors T11 and T12 are decreased and the collector currents $I_{21}$ and $I_{22}$ of the transistors T21 and T22 are increased so that the voltages $V_1$ and $V_2$ are increased to correct the differential detected signal S4 to become the reference value. Accordingly, also in this case, the waveforms of the voltages $V_1$ and $V_2$ can be made symmetrical to each other.

According to the circuit arrangement shown in FIG. 3, if the differential detected signal S4 is fluctuated from the reference value, the currents derived from or taken in the output lines 34A and 34B are controlled such that the waveforms of the voltages at the both ends of the capacitor 32, accordingly, the voltages $V_1$ and $V_2$ can always be held to be symmetrical to each other whose intermediate potential is equal to the reference value. Such correcting operation is not limited to a case in which the voltages $V_1$ and $V_2$ are changed at displaced timings but can similarly be applied to a case in which the changing speed is changed and the changing waveform is changed.

Thus, according to the circuit arrangement shown in FIG. 3, since the transistors T21 and T22 in the positive side current mirror circuit 52 are operated through the negative side differential circuit 45 in an opposite manner to that of the transistors T11 and T12 in the differential circuit 45, it is possible to increase the sensitivity of the correcting operation to an extent which is enough for practice. In addition, since the circuit arrangement of the current mirror circuit is formed complementary to the circuit arrangement of the differential circuit 45, the two phase voltage signal generating circuit having the circuit arrangement shown in FIG. 3 can easily be formed into an integrated circuit.

However, when it is not necessary to improve the sensitivity of the correcting operation, instead of the current mirror circuit 52, constant current sources 61 and 62 may be connected to the output lines 34A and 34B, respectively, as shown in FIG. 8.

While in the above embodiment the speed-up capacitors 57 and 58 are used as the differential detecting circuit, such speed-up capacitors 57 and 58 may be omitted.

While in the voltage limiting circuit 39 in FIG. 3, the diodes D11 to D14 are used to limit the voltage, the diodes D11 to D14 can be replaced with transistors T31 to T34 as shown in FIG. 9 with the same effect as above being achieved.

Figure 10:
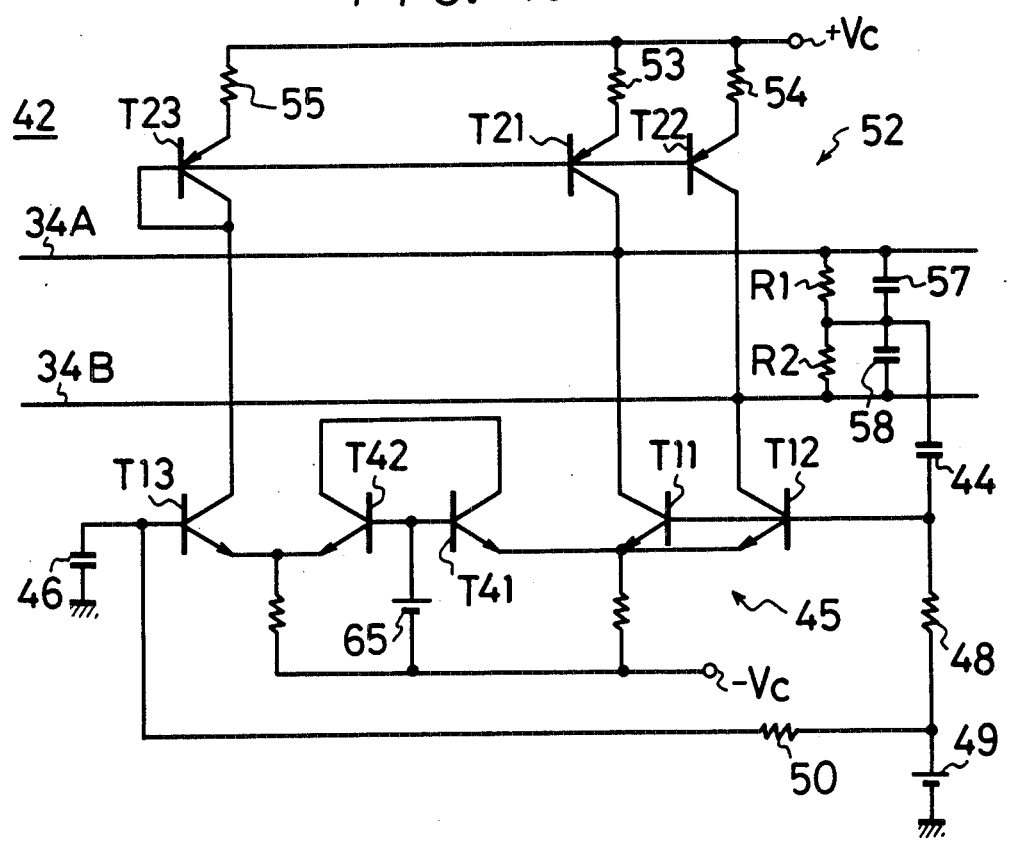
FIG. 10 is a circuit diagram showing a further embodiment of the waveform correcting circuit according to the present invention.

Further in the differential circuit 45 shown in FIG. 3, in order that the current derived through the transistors T11 and T12 to the negative voltage source $-V_C$ from the output lines 34A and 34B and the current taken through the transistors T21 and T22 of the current mirror circuit 52 to the output lines 34A and 34B from the positive current source $+V_C$ are made substantially equal to each other in electricity amount, as shown in FIG. 10, it is possible that transistors T41 and T42, the bases of which are connected together to a reference voltage source 65, are respectively connected to the differential transistors T11, T12 and T13 to thereby construct a double differential circuit.

Figure 11:
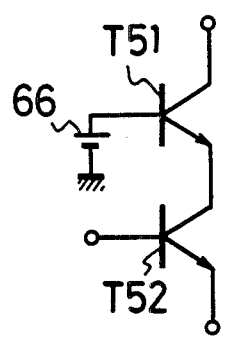
FIGS. 11 and 12 are respectively circuit diagrams showing other circuit arrangements of respective transistors used in the present invention.
Figure 12:
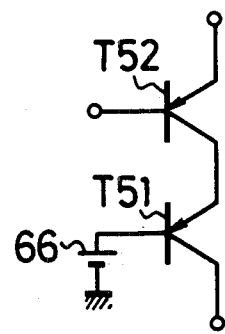

In the above embodiment, it is also possible that as shown in FIG. 11 or 12, a pair of transistors T51 and T52 in which they are connected in cascade and a bias voltage source 66 is connected to the base of the transistor 51, are used as each of the transistors.

As set forth above, according to the present invention, since the two phase voltage signals are generated at the both ends of the voltage waveform generating capacitor by the current switching circuit and the current is derived from or taken in the both ends of the above capacitor in response to the change of the two phase voltage signals generated at the both ends of the capacitor, it is possible to realize the two phase voltage signal generating circuit which can easily generate the two phase voltage signals having the waveforms symmetrical enough for practice and which is suitable for being formed into the integrated circuit.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A two phase voltage signal generating circuit for generating a pair of trapezoidal wave signals of phases opposite to each other comprising:
   (A) an input terminal supplied with an input pulse signal;
   (B) a capacitor having a first and second terminal;
   (C) first and second voltage limiting circuits connected to the first and second terminals of the capacitor respectively for limiting the voltage at each end of said capacitor within a predetermined voltage range;
   (D) a current control circuit connected to said input terminal for supplying a first and second voltage to the first and second terminals of the capacitor, respectively, the first and second voltage being of opposite polarity in response to said input pulse signal to generate said pair of trapezoidal wave voltage signals at both ends of said capacitor;
   (E) a detecting circuit connected to said first and second terminals of the capacitor and responsive to both said trapezoidal wave voltage signals for detecting a change in the intermediate voltage of said pair of trapezoidal wave voltage signals; and
   (F) a symmetry control circuit connected to said first and second terminals of the capacitor and to an output of said detecting circuit and responsive to said detecting circuit for controlling said first and second voltage such that said pair of trapezoidal wave voltage signals become substantially symmetrical to each other.

2. A two phase voltage signal generating circuit according to claim 1 wherien each of said voltage limiting circuits includes a pair of diodes poled in the same direction and serially connected between a pair of voltage sources which determine said predetermined voltage range, and the point at which the diode of one pair are connected forming a first connection point and the point at which the diodes of the other pair are connected forming a second connection point wherein the first and second connecting points are coupled to the first and second terminals of said capacitor.

3. A two phase voltage signal generating circuit according to claim 1, wherein said detecting circuit includes a pair of resistors connected in series between the first and second terminals of the capacitor and the intermediate point of said resistors is the output of said detecting circuit.

4. A two phase voltage signal generating circuit according to claim 3, wherein said detecting circuit further includes a pair of capacitors serially connected across said resistors and the connection point between said capacitors is connected to the intermediate point of said resistors.

5. A two phase voltage signal generating circuit according to claim 3, wherein said symmetry control circuit includes first and second controllable current sources connected to the first and second terminals of said capacitor respectively, and said first and second controllable current sources are controlled by the voltage of said intermediate point of said resistors.

6. A two phase voltage signal generating circuit according to claim 5, wherein said first and second controllable current sources include first and second transistors, the bases of said first and second transistors being commonly connected to said intermediate point of said resistors, the emitters of said first and second transistors being commonly connected to an emitter of a third transistor, the base of which is connected to a reference voltage source, and the collectors of said first and second transistors being connected to the first and second of said capacitor respectively.

7. A two phase voltage signal generating circuit according to claim 1, wherein said current control circuit includes first and second differential circuits, collectors of first transistors of said first and second differential circuits being commonly connected to the first terminal of said capacitor, and collectors of second transistors of said first and second differential circuits being commonly connected to the second terminal of said capacitor.

* * * * *